(12) United States Patent
DeNatale et al.

(10) Patent No.: US 7,989,915 B2
(45) Date of Patent: Aug. 2, 2011

(54) VERTICAL ELECTRICAL DEVICE

(75) Inventors: Jeffrey F. DeNatale, Thousand Oaks, CA (US); Stefan C. Lauxtermann, Camarillo, CA (US); Per-Olov Pettersson, Thousand Oaks, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 1101 days.

(21) Appl. No.: 11/485,034

(22) Filed: Jul. 11, 2006

(65) Prior Publication Data

US 2008/0122031 A1   May 29, 2008

(51) Int. Cl.
H01L 27/082 (2006.01)
H01L 27/102 (2006.01)
H01L 29/70 (2006.01)
H01L 31/11 (2006.01)
H01L 29/40 (2006.01)

(52) U.S. Cl. ........................ 257/532; 257/664
(58) Field of Classification Search .................. 257/532, 257/664, E23.141, E21.495; 438/386, 619
See application file for complete search history.

(56) References Cited

U.S. PATENT DOCUMENTS

| | | | | |
|---|---|---|---|---|
| 3,885,129 | A * | 5/1975 | Fabricius | 219/553 |
| 4,855,017 | A | 8/1989 | Douglas | 156/643 |
| 4,961,821 | A | 10/1990 | Drake et al. | 156/647 |
| 5,421,083 | A | 6/1995 | Suppelsa et al. | 29/852 |
| 5,501,893 | A | 3/1996 | Laermer et al. | 428/161 |
| 6,278,181 | B1 | 8/2001 | Maley | 257/712 |
| 6,458,615 | B1 | 10/2002 | Fedder et al. | 438/50 |
| 6,565,730 | B2 | 5/2003 | Chakravorty et al. | 205/122 |
| 6,605,551 | B2 * | 8/2003 | Wermer et al. | 438/778 |
| 6,716,737 | B2 | 4/2004 | Plas et al. | 438/612 |
| 6,717,071 | B2 | 4/2004 | Chang et al. | 174/266 |
| 6,852,627 | B2 | 2/2005 | Sinha et al. | 438/687 |
| 6,960,479 | B2 | 11/2005 | Li et al. | 438/3 |
| 6,960,495 | B2 | 11/2005 | Vyvoda et al. | 438/131 |
| 6,963,483 | B2 | 11/2005 | Chakravorty et al. | 361/306.3 |
| 6,968,110 | B2 | 11/2005 | Patel et al. | 385/131 |
| 6,984,561 | B2 | 1/2006 | Herner et al. | 438/257 |
| 6,995,072 | B2 | 2/2006 | Walker et al. | 438/400 |
| 2002/0134581 | A1 | 9/2002 | Figueroa et al. | |

(Continued)

FOREIGN PATENT DOCUMENTS

EP    096723 A1    6/1999

(Continued)

OTHER PUBLICATIONS

Semiconductor Equipment Assessment. Results Bulletin. Microsystems Production Evaluated STS Aspect Silicon Etch Cluster Tool. available online at: http://www.sea.rl.ac.uk/NewSEA/newpubs/microspect/microspect_results.pdf.

(Continued)

Primary Examiner — William M. Brewster
(74) Attorney, Agent, or Firm — Koppel, Patrick, Heybl & Philpott (57) ABSTRACT

A vertical electrical device includes a region in a substrate extending from a surface of the substrate, the region having an inner wall and an outer wall circumscribing the inner wall. An inner electrically conductive layer is disposed on the inner wall and an outer electrically conductive layer is disposed on the outer wall, with an electrically insulative material disposed between the inner and outer layers. An electrical conductor in the substrate is bounded by the inner electrically conductive layer.

18 Claims, 6 Drawing Sheets

U.S. PATENT DOCUMENTS

| | | | |
|---|---|---|---|
| 2003/0003724 A1 | 1/2003 | Uchiyama et al. | |
| 2003/0104649 A1 | 6/2003 | Ozgur et al. | |
| 2003/0168342 A1* | 9/2003 | Chakravorty et al. | 205/122 |
| 2004/0069529 A1 | 4/2004 | Oggioni et al. | |
| 2004/0119166 A1 | 6/2004 | Sunohara | |
| 2004/0166688 A1 | 8/2004 | Xie et al. | |
| 2005/0093048 A1 | 5/2005 | Griffiths | |
| 2005/0093049 A1 | 5/2005 | Kundalgurki et al. | |
| 2005/0099762 A1 | 5/2005 | Wermer et al. | |
| 2005/0287760 A1 | 12/2005 | Yan et al. | |
| 2006/0003566 A1 | 1/2006 | Emesh | |
| 2006/0091503 A1* | 5/2006 | Wu et al. | 257/640 |
| 2006/0278331 A1* | 12/2006 | Dugas et al. | 156/230 |

FOREIGN PATENT DOCUMENTS

| | | |
|---|---|---|
| EP | 0926723 | 6/1999 |
| WO | WO 8302368 A1 | 7/1983 |
| WO | WO 9908318 | 2/1999 |

OTHER PUBLICATIONS

Semiconductor Equipment Assessment, Results Bulletin, Microsystems Production Evaluated STS Aspect Silicon Etch Cluster Tool, available online at: http://www.sea.rl.ac.uk/NewSEA/newpubs/microspect/microspect_results.pdf.

Eisenbraun, et al., 3D Integration—The Packaging Technology for Tomorrow'S Performance Needs, Chip 9, Unaxis Semiconductors, (Sep. 2003), pp. 14-17.

Liu, C., Progress in MEMS and Micro Systems Research,IMAPS/ACerS 1$^{st}$ International Conference and Exhibition on Ceramic Interconnect and Ceramic Microsystems Technologies (CICMT), Baltimore Marriott Waterfront Hotel, Baltimore MD, (Apr. 10-13, 2005).

Pham, N. et al., IC-Compatible Two-Level Bulk Micromachining Process Module for RF Silicon Technology, IEEE Transactions on Electron Devices, vol. 48, No. 8, (Aug. 2001), pp. 1756-1764.

Garrou, Phillip, Future ICs Go Vertical, Research & Development Institute, Feb. 1, 2005, pp. 1-8.

George, S. M. et al., Surface Chemistry for Atomic Layer Growth, J. Phys. Chem., vol. 100, No. 31, 1996, pp. 13121-13131.

Notice of Allowance, U.S. Appl. No. 11/167,014 mailed Jan. 28, 2009.

Non-Final Rejection, U.S. Appl. No. 11/167,014, mailed Aug. 1, 2008.

Final Rejection, U.S. Appl. No. 11/167,014 mailed Mar. 17, 2008.

Non-Final Rejection, U.S. Appl. No. 11/167,014 mailed Aug. 27, 2007.

* cited by examiner

VERTICAL ELECTRICAL DEVICE

BACKGROUND OF THE INVENTION

The present invention relates to electrical devices, and particularly to vertical devices that extend through or partially through a substrate.

Through-wafer vias are an enabling technology for implementing three dimensional (3D) architectures in multilayer circuits and structures that combine semiconductor circuitry with other devices, such as microelectromechanical systems (MEMS) and electro-optical devices. Such vias permit the routing of signals between separate layers of circuitry, enabling greater processing power and functionality without increasing the lateral footprint of the device. This capability can be very important for applications such as, for example, laser radar, high performance RF subsystems, and high performance electronic imagers using pixel level image processing.

MEMS are very small electromechanical devices that combine many of the most desirable aspects of conventional mechanical and solid state devices. MEMS typically provide compact size and high performance while maintaining the manufacturability of semiconductor devices. These benefits have been demonstrated in a number of different device and application areas, including sensing, optics, communications, and health sciences.

The fabrication of MEMS devices often differs from conventional planar semiconductor devices. By virtue of their mechanical operation, MEMS devices may involve significant physical thickness and high aspect ratios for optimal performance. This has led to the development of a number of fabrication processes and processing tools to realize deep, high aspect ratio features at microdevice dimensions. For the case of Si etching, the use of a high density plasma and time-sequenced etch chemistry can provide high aspect ratio and large etch depths. For example, in devices using capacitive sensing of interdigitated electrodes to detect displacements, the high aspect ratio of the electrodes helps maximize the baseline capacitance and capacitance change for more sensitive detection. Such deep etched structures may have dimensions of about 2 microns wide and from about 20 microns to about 100 microns deep, with a narrow spacing between adjacent features of 2 microns, for example. Such high aspect ratio fabrication processes can be very useful in the implementation of through-wafer interconnects by decreasing the achievable diameter and increasing the achievable lateral density of vias.

Because of the desirability of maintaining a small size in many applications, both semiconductor and MEMS devices may also utilize vias, which provide electrical connections between various portions of the device circuitry by passing through the wafer, substrate, or other layers of the device, thereby enabling the device elements to be stacked in a vertical direction, relative to the plane of the device, rather than being spaced on the device in the horizontal direction relative to one another.

One application that exploits the benefits of 3D integration is that of electronic imaging arrays. The integration of sensor arrays with 3D stacked layers of readout and signal processing circuitry can enable implementation of massively parallel, densely interconnected imaging focal plane architectures, resulting in high resolution, high fill factor pixels, ultra-wide dynamic range, multispectral capability and very fast imaging performance.

Traditional via conductors of this type, however, because of their characteristic coupling to the substrate and other circuit elements and characteristic impedance, may not provide sufficient isolation and/or signal transmission characteristics for high frequency operation. High frequency performance can be limited by transmission loss, reflection loss, radiation, and capacitive coupling from the via itself.

Another area that can be improved with 3D integration is capacitive circuit components. Planar RF filters and switched capacitor bank filters, for example, occupy significant die area and integrated single-chip filters are consequently often limited by die size, since metal-insulator-metal (MIM) capacitors can require substantial die area for large capacitance values. By utilizing vertical capacitor structures, substantial reductions in size can be achieved, with a direct correlation to reduced die cost.

Such vertical capacitor structures could also provide advantages in readout circuits, such as those for electronic imaging applications and active lidar. These circuits use planar capacitors for storage of photogenerated charge. For small pixel devices, the amount of charge storage capacity provided by conventional integrated circuit fabrication technology is limited by the physical constraints of pixel pitch. This limits the maximum achievable full well capacity, and can thus negatively impact important focal plane array characteristics, such as maximum intensity and dynamic range. Having the ability to significantly increase the capacitor size and/or the number of capacitors in a circuit, while preserving small die area, could relax these constraints and allow greater design flexibility and improved device performance.

For these reasons, a need has developed in the art for a vertical device, extending through or partially through a substrate, that can be implemented in electronics applications involving 3D architectures and structures that combine multiple layers of semiconductor circuitry or combine semiconductor circuitry with other devices, as well as employing a fabrication process which enables high density structures and is carried out at sufficiently low temperatures to be compatible with semiconductor circuitry.

BRIEF SUMMARY OF THE INVENTION

A vertical electrical device includes a region in a substrate extending from a surface of the substrate, the region having an inner wall and an outer wall circumscribing the inner wall. An inner electrically conductive layer is disposed on the inner wall and an outer electrically conductive layer is disposed on the outer wall, with an electrically insulative material disposed between the inner and outer layers. An electrical conductor in the substrate is bounded by the inner electrically conductive layer.

The device may be electrically connected to an active or passive electronic circuit on the substrate. The electrical connection may be a planar conductor disposed on the surface of the substrate. Additional circuit layers may be disposed on the substrate, with additional active or passive electronic circuitry connected to the device by additional planar conductors.

In one embodiment, the inner and outer electrically conductive layers are metal layers. In addition, the electrically insulative material may be made of parylene or another organic polymer. The substrate may be a semiconductive substrate, and in particular, a silicon substrate. In addition, it may be desirable in some embodiments for the electrical conductor and the outer electrically conductive layer to extend beyond the substrate at one or both surfaces of the substrate, and a portion of the electrical conductor proximate the surface of the substrate may be reduced in size relative to the remaining portion of the conductor.

In one specific application for the device, the insulative material and the outer conductive layer provide high frequency isolation for the electrical conductor, the device thus operating as a high frequency shielded electrical conductor. In this application, the inner electrically conductive layer, the outer electrically conductive layer, the electrically insulative material, and the electrical conductor may be fabricated with dimensions and of materials selected to optimize the radio frequency properties of the device.

In another application, the outer conductive layer is a first electrode, the electrical conductor is a second electrode, and the electrically insulative material is a dielectric material, such that the device operates as a coaxial capacitor.

A method for making a vertical electrical device according to the invention begins by forming a region into a substrate through a surface of the substrate, the region having an inner wall and an outer wall circumscribing the inner wall.

Inner and outer electrically conductive layers are formed on the inner and outer walls, respectively, then an electrically insulative material is inserted between the inner and outer electrically conductive layers.

Finally, an electrical conductor is formed in the substrate, bounded by the inner electrically conductive layer A electrical connection may be formed between the electrical conductor and an electronic circuit on a circuit layer. This connection, in particular, may be made by forming a planar conductor on the surface of the substrate that connects the electrical conductor to the active electronic circuit. In addition, the device may be part of a multi-layer or stacked circuit architecture, where the electrical conductor connects to additional electronic circuits on additional circuit layers, which can be positioned on one or both sides of the substrate.

In a more particular embodiment, the inner and outer electrically conductive layers are formed by plating metal, electrically conductive layers onto the inner and outer walls. Alternatively, the inner and outer layers may be formed by atomic layer deposition (ALD) or other suitably conformal deposition method. In addition, the electrically insulative material may be inserted by depositing conformal vapor deposited polymers, such as parylene, between the inner and outer electrically conductive layers. Alternatively, this layer may be deposited by other suitably conformal deposition techniques, such as ALD or by introduction of a curable liquid polymer. The substrate may be a semiconductive substrate, such as a semiconducting silicon substrate.

The method may be used to form a conductor through the substrate by removing material from the substrate at a second surface of the substrate to expose the conductor at the second surface. Moreover, the portion of substrate removed from the second surface may be reduced in diameter relative to the diameter of the electrical conductor. The removal of material from the substrate may be accomplished by isotropic or anisotropic etching.

When the device is to operate as a high frequency shielded electrical conductor, the dimensions of and materials for the inner electrically conductive layer, the outer electrically conductive layer, the electrically insulative material, and the electrical conductor are selected to optimize the radio frequency properties of the device.

When the device is to operate as a coaxial capacitor, the outer electrically conductive layer is formed as a first electrode, the electrical conductor is formed as a second electrode, and a dielectric material is selected for the electrically insulative material. Dimensions and material properties may be selected to give the desired electrical characteristics, such as capacitance and effective resistance.

In a more particular embodiment, a vertical coaxial capacitor is fabricated in a semiconductive substrate, by forming a first region into the substrate through a first surface of the substrate, the first region having a first outer wall and a first bottom surface. A second region is formed into the substrate through a second surface of the substrate, the second region having a second outer wall larger in diameter than the first outer wall, such that the first region extends through the second bottom surface.

Next, an outer metal, electrically conductive layer is plated on the first outer wall, the second bottom, and the second outer wall, then a parylene dielectric is deposited on the outer electrically conductive layer to establish an electrically insulative layer. An inner metal, electrically conductive layer is plated on the electrically insulative layer and an electrical conductor is deposited such that it is bounded by the inner electrically conductive layer.

The outer conductive layer is a first electrode for the capacitor and the electrical conductor is a second electrode for the capacitor.

DETAILED DESCRIPTION OF THE INVENTION

Figure 1A:
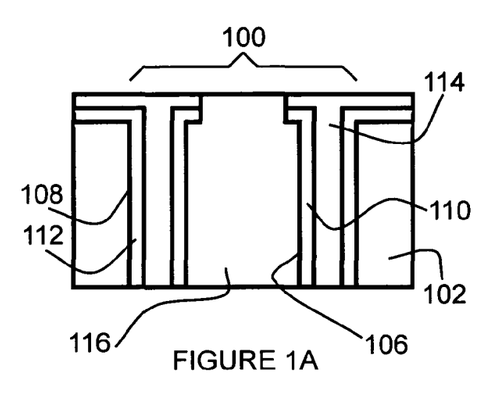
FIG. 1A is a cross sectional view of an electrical device.
Figure 1B:
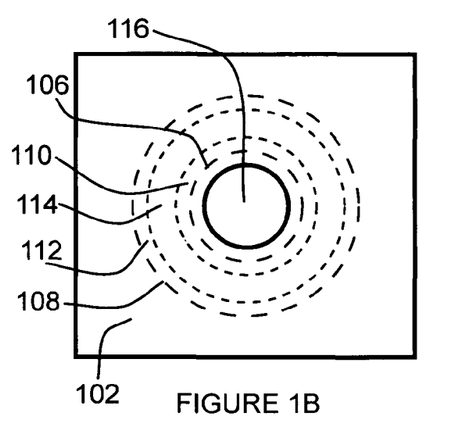
FIG. 1B is a plan view of the device shown in FIG. 1A.

FIGS. 1A and 1B depict a vertical electrical device constructed according to the invention, with FIG. 1A showing a cross sectional view of the device in a side elevation and FIG. 1B a plan view. A region 100 extends into a substrate 102. The region is defined by an inner wall 106 and an outer wall 108 circumscribing the inner wall.

An inner electrically conductive layer 110 is disposed on the inner wall 106 and an outer electrically conductive layer 112 is disposed on the outer wall 108. An electrically insulative material 114 is placed between the inner and outer layers. An electrical conductor 116 in the substrate is bounded by the inner conductive layer 110.

This device is useful as a via conductor that can be implemented in electronics applications involving 3D architectures and structures that combine multiple layers of semiconductor circuitry or that integrate semiconductor circuitry with other devices. The device is particularly advantageous because it can be made, as will be further described below, using fabrication processes that not only enable high density structures, but that can be implemented at sufficiently low temperatures to be compatible with semiconductor circuitry.

The device can be used to provide improved isolation in order to enhance high frequency performance by avoiding transmission loss, reflection loss, radiation, and capacitive coupling from the device to the substrate and to other circuit elements.

The device can also be implemented as a capacitive circuit component, with the vertical design reducing the necessary die area required, with a direct correlation to reduced die cost.

Additional advantages of the invention for these applications will be apparent by describing a method of making the device, as depicted in FIGS. 2 through 7, in which FIGS. 2A through 7A are cross sectional views of the steps performed on a work piece in a side elevation and FIGS. 2B through 7B are plan views corresponding to FIGS. 2A through 7A.

The method begins, for the embodiment depicted in FIG. 1, with a semiconducting substrate 102, having a first surface 104 and a second surface 118. This substrate may contain active or passive electronic circuitry on one or both surfaces.

Figure 2A:
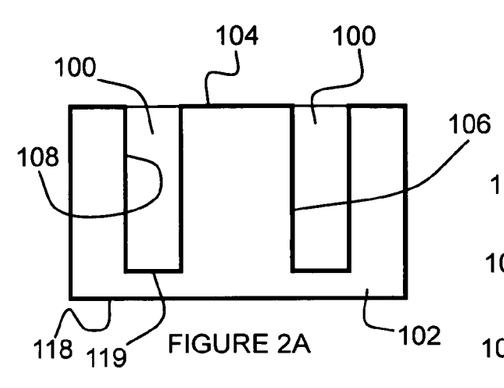
FIGS. 2A, 3A, 4A, 5A, 6A and 7A are cross sectional views of the steps performed on a work piece to create an electrical device.
Figure 2B:
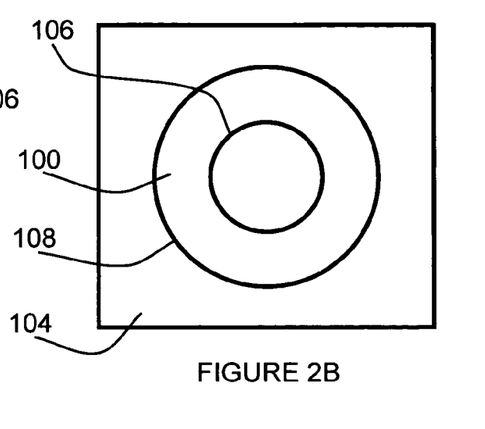
FIGS. 2B, 3B, 4B, 5B, 6B and 7B are plan views of the work piece corresponding to FIGS. 2A, 3A, 4A, 5A, 6A, and 7A, respectively.

A region 100 is formed by etching into the substrate, with the region extending from the first surface 104 towards the second surface 118, such that the region is defined in the substrate by an inner wall 106, an outer wall 108 circumscribing the inner wall, and a bottom surface 119 between the outer and inner walls. Such etching may be accomplished using techniques well known to those skilled in the art of MEMS fabrication. One such process, for example, is Deep Reactive Ion Etching (DRIE) of Si using a time-sequenced etch chemistry of SF6 and C4F8 gasses.

Figure 3A:
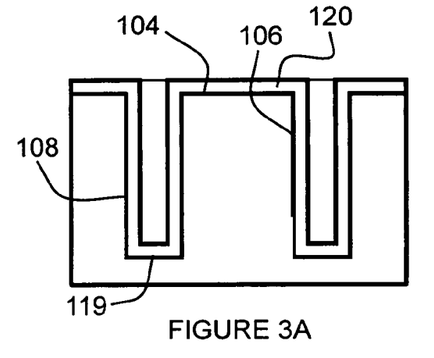
Figure 3B:
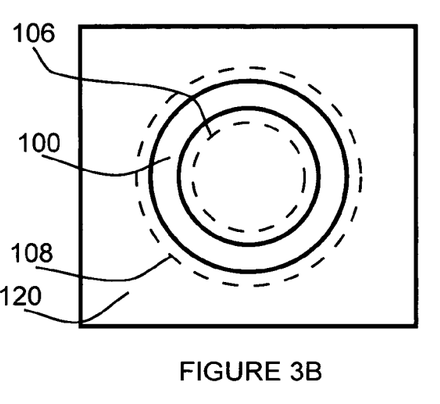

Next, as shown in FIG. 3, an electrically conductive conformal layer 120 is deposited onto the first surface 104 and into the region 100, such that the shielding layer is disposed, within the region, on the outer wall 108, the inner wall 106, and the bottom surface 119. This deposition may be accomplished by, for example, plating a metal or by employing an atomic layer deposition/chemical vapor deposition approach.

Figure 4A:
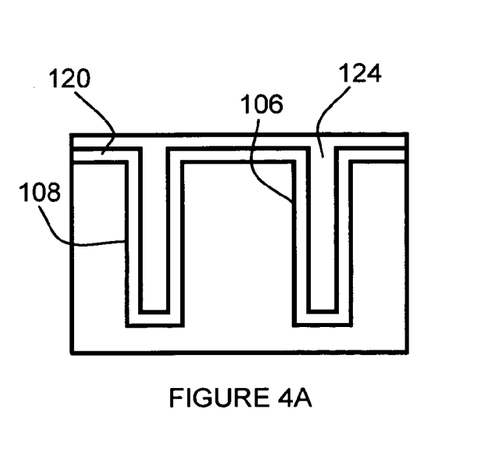
Figure 4B:
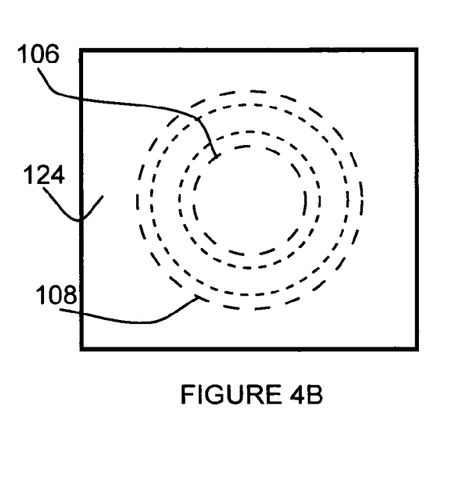

An insulating material, such as parylene, is then deposited over the shielding layer, as shown in FIG. 4, such that the insulating material defines an electrically insulating layer 124 disposed on the conformal layer 120 over the first surface 104 and substantially filling the remainder of the region 100. The deposition may be accomplished by a variety of methods, such as using conformal vapor deposition of a dielectric, which may be a polymer, such as parylene, depositing an oxide using ALD, or filling with a curable liquid polymer. Other approaches that lead to complete filling of the trench region 100 may also be suitable.

Figure 5A:
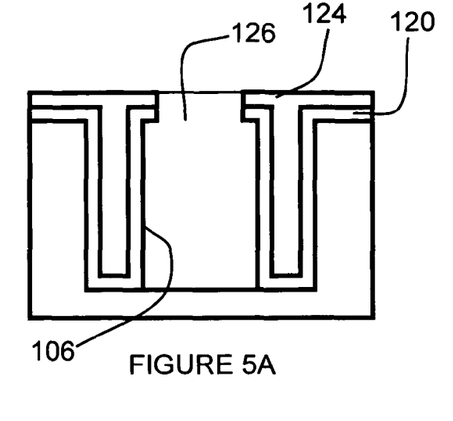
Figure 5B:
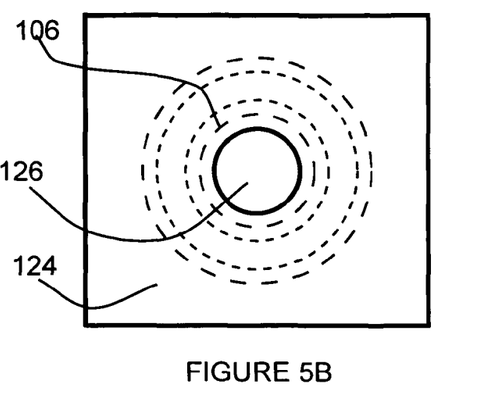

Now referring to FIG. 5, a portion 126 of the substrate circumscribed by the region 100 and within the inner wall 106 is removed through the insulating layer 124 and the conducting layer 120. This removal can be accomplished, for example, by an isotropic or anisotropic silicon etch, such as $XeF_2$, $SF_6$, Bosch etch, KOH, or TMAH. The portion of the layer 120 on the inner wall 106 helps to prevent lateral blooming of the etch and preserve the shape of the region 100.

Figure 6A:
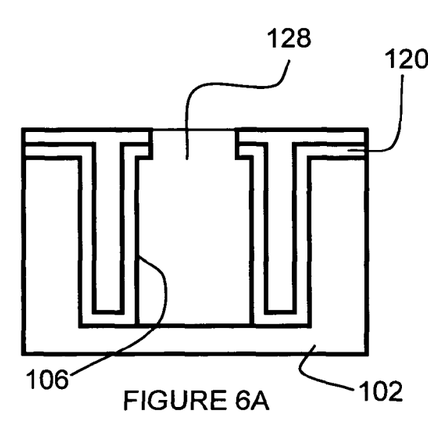
Figure 6B:
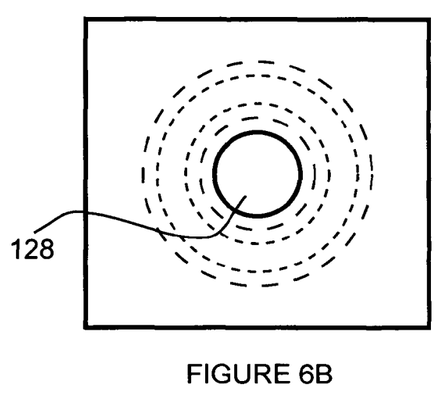

Next, as in FIG. 6, an electrically conducting material 128 is deposited within the region previously occupied by the removed portion 126 of the substrate, i.e., the region bounded by the inner wall 106, using the portion of the layer 120 disposed on the inner wall 106 as a seed layer for the deposition of the material 128.

Figure 7A:
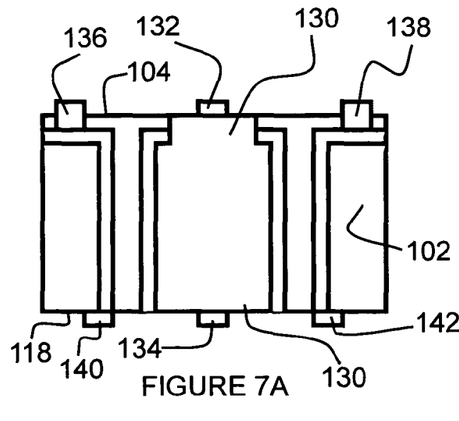
Figure 7B:
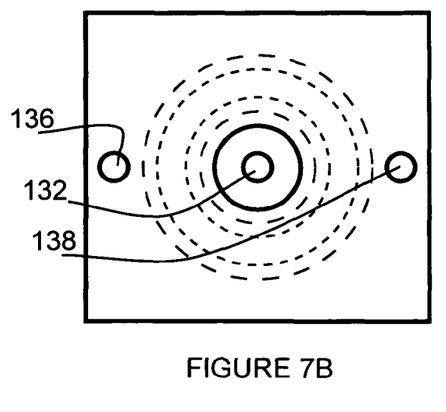

Finally, as shown in FIG. 7, a portion of the substrate 102 is removed at a second surface 118 to expose the electrically conducting material, thereby providing a shielded electrical conductor 130 extending vertically through the substrate. Chemical mechanical polishing (CMP) may be used to obtain a planar top surface and remove any overplated material or surface topology. The conductor 130, which is isolated by the shielding layer 120, can provide a high frequency shielded, coaxial electrical interconnection between the first surface 104 and the second surface 118. Electrical contacts, such as contacts 132 and 134 to the conductor 130, may be added to facilitate connections between electrical components on the two sides of the device. Additional electrical contacts, such as contacts 136, 138, 140 and 142 to the layer 120, can be provided to facilitate shielding electronic components associated with the device. A variety of other designs may be employed to transition the vertical coaxial interconnect with planar or vertical conductors.

Figure 8:
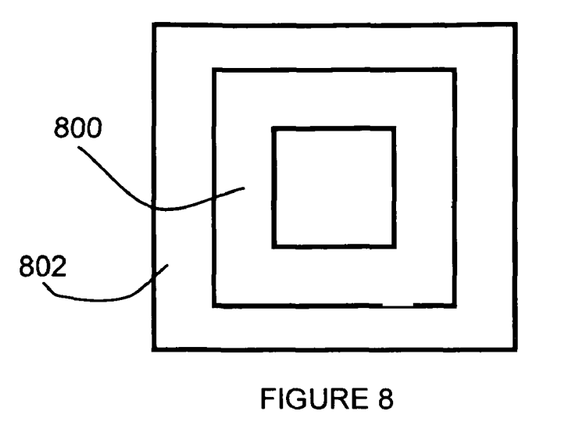
FIGS. 8, 9 and 10 are plan views analogous to FIG. 2B, depicting respective alternative embodiments involving different shapes for the device of the invention.
Figure 9:
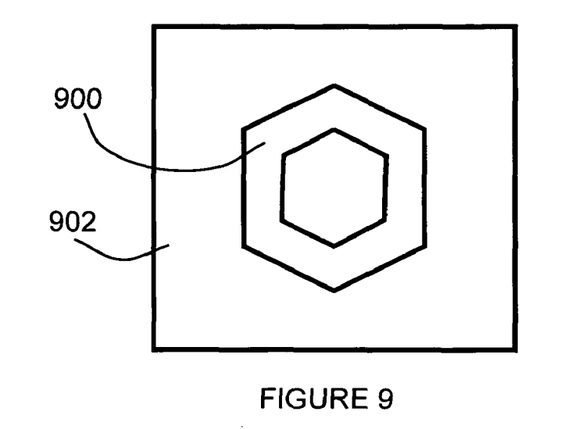
Figure 10:
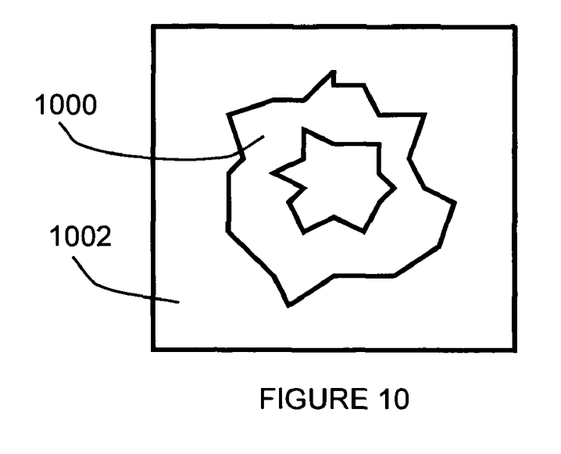

Other embodiments of the invention may be desirable for some applications of the invention. The hollow cylindrical shape of the region 100 shown in FIGS. 1-7, for example, may not be the most desirable for some applications. FIGS. 8-10, which are plan views analogous to FIG. 2B, depict some of the possible alternatives. In FIG. 8, a closed circumferential region 800, having a nominally square cross section, is formed in a substrate 802 and corresponds to the region 100 in FIG. 2B. Other examples are shown in FIG. 9, where a region 900 having the shape of a six sided, regular polyhedron is formed in a substrate 902, and in FIG. 10, where a region 1000 having the shape of an irregular polyhedron is formed in a substrate 1002.

Another embodiment of the invention may be highly desirable when the amount of surface area available on one surface is significantly restricted. One example of such a situation is when the device is being processed in a substrate containing active electronic circuitry, and the area of the etched region on one surface precludes locating active circuitry in this area. This situation arises, for example, with capacitive circuit elements, when it is desirable to limit the amount of area used for the capacitor on one side of the substrate. For this application, it is desirable for the penetration from the surface containing active circuitry to be smaller than from the opposite surface, and it would be etched to a depth below that of the active circuitry. Beyond this level, the etched region can transition to a larger diameter region etched from the opposite surface without impacting the functionality of the active circuitry.

Figure 11A:
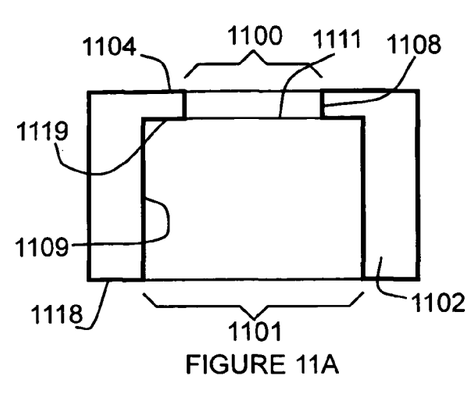
FIGS. 11A, 12A, and 13A are cross sectional views of an alternative method for fabricating a vertical electrical device according to the invention.
Figure 11B:
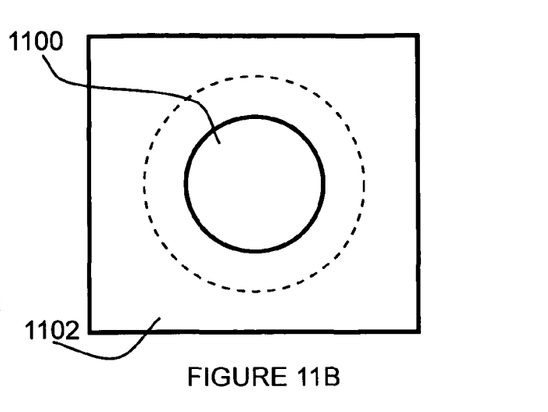
FIGS. 11B, 12B, and 13B are plan views corresponding to FIGS. 11A, 12A, and 13A, respectively.
Figure 12A:
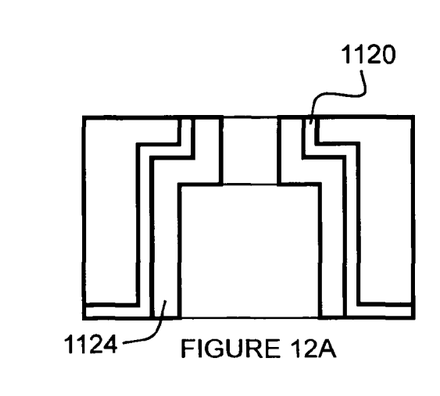
Figure 12B:
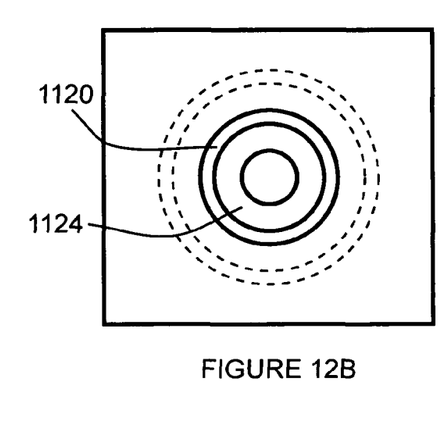
Figure 13A:
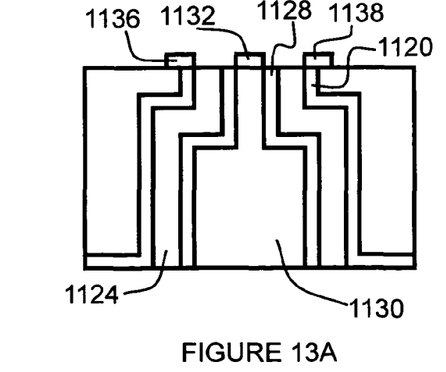
Figure 13B:
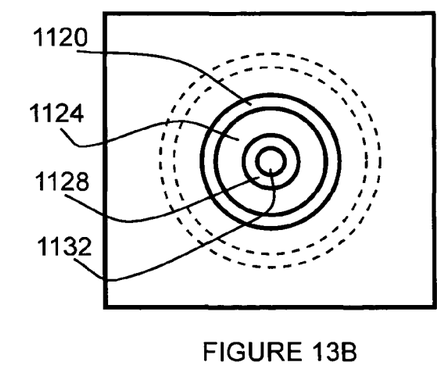

This may be accomplished by an alternative method, where the penetration is formed by etching from two surfaces and using different diameters for the etch, as depicted in FIGS. 11 through 13. FIGS. 11A through 13A are cross sectional views and FIGS. 11B through 13B are plan views.

The alternative method begins, as shown in FIG. 11, with a substrate 1102, having a first surface 1104 and a second surface 1118.

A first region 1100 is formed by etching into the substrate, with the region extending from the first surface 1104 towards the second surface 1118, such that the region is defined in the substrate by a first outer wall 1108 and a first bottom surface 1111. Such etching may be accomplished using techniques well known to those skilled in the art of MEMS fabrication. One such process, for example, is Deep Reactive Ion Etching (DRIE) of Si using a time-sequenced etch chemistry of SF6 and C4F8 gasses. The etching may be from one side or two sides of the substrate, and the etched regions may have different diameters, as in the present process, where a second region 1101 is formed by etching into the substrate from the second surface 1118, the second region having a second outer wall 1109 larger in diameter than the first outer wall 1108 and a second bottom surface 1119, such that the second region extends toward the first surface 1104 and reaches the first bottom surface 1111.

Next, as shown in FIG. 12, an electrically conductive conformal outer layer 1120 is deposited onto the second surface

1118, the second outer wall 1109, the second bottom surface 1119, and the first outer wall 1108. This deposition may be accomplished by, for example, plating a metal or by an atomic layer deposition/chemical vapor deposition approach.

An insulating material, such as parylene, is then deposited over the outer layer 1120, such that the material defines an electrically insulating layer 1124 disposed on the conformal layer 1120. Such deposition may be accomplished by a variety of methods, such as using conformal vapor deposition of a dielectric, which may be a polymer, such as parylene, or depositing an oxide using ALD. Other approaches that lead to conformal sidewall coating may also be suitable.

As shown in FIG. 13, an inner electrically conductive layer 1128 is then deposited on the insulating layer 1124. An electrical conductor 1130 is deposited on and within the layer 1128. Finally, chemical mechanical polishing (CMP) or another suitable technique is used to obtain a planar top surface and remove any overplated material or surface topology. The conductor 1130 is isolated by the shielding layer 1120, so that the resulting device can provide a high frequency shielded, coaxial electrical interconnection between the first surface 1104 and the second surface 1118, or the outer conductive layer 1120 can operate as the first electrode for a capacitor and the electrical conductor 1130 as the second electrode.

Electrical contacts, such as contact 1132 to the conductor 1130 and contacts 1136 and 1138 to the outer conductive layer 1120, may be added to facilitate connections between the device and circuit components located on either side of the substrate. Where the device is configured as a capacitor, these contacts, as shown by the contacts 1132, 1136, and 1138, would typically be located on one side of the device to connect to circuitry on that side, although contacts can readily be included on both sides of the device where that is desirable.

Figure 14:
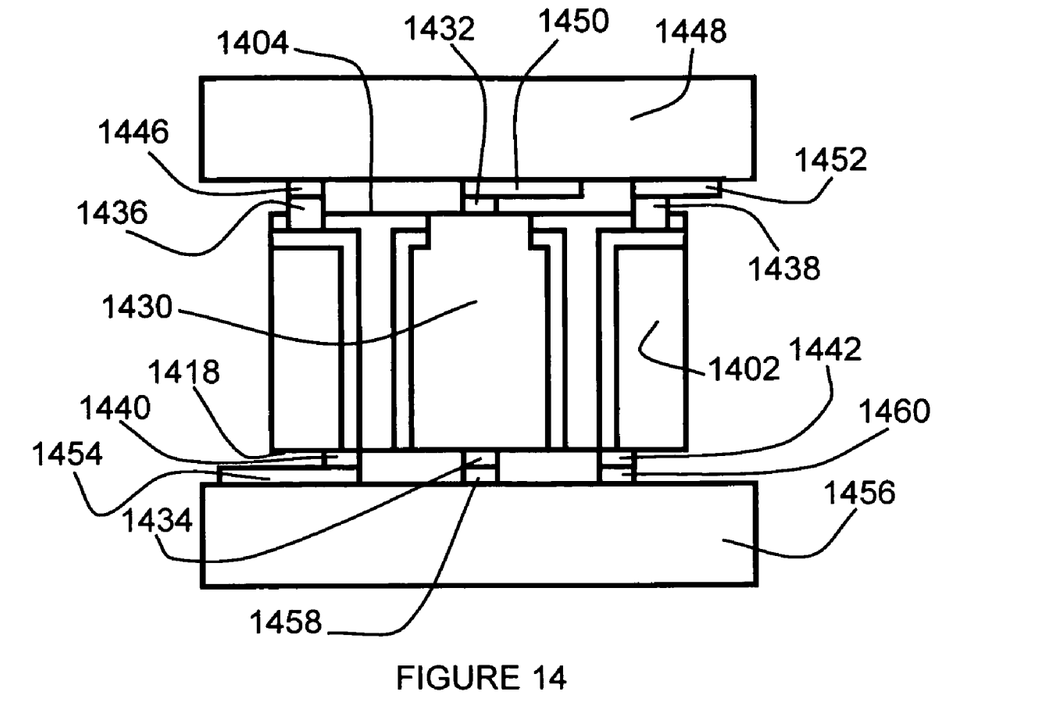
FIG. 14 is a cross sectional view showing a more particular embodiment of the invention with connections to electronic circuits.

FIG. 14, which is a sectional view analogous to FIGS. 7A, illustrates how the inventive device may be connected to multiple additional circuit elements located in multiple layers both above and below the substrate 1402 in which the device is located. Circuit elements located in a first circuit layer 1448, for example, are connected to the device by an electrical contact 1446, which connects to the contact 1436, and by planar conductors 1450 and 1452, which connect to electrical contacts 1432 and 1438, respectively.

Similarly, circuit elements located in a second circuit layer 1456 are connected to the device by electrical contacts 1458 and 1460, which are connected to contacts 1434 and 1442, respectively, and by a planar conductor 1454, which is connected to contact 1440.

The preferred embodiments of this invention have been illustrated and described above. Modifications and additional embodiments, however, will undoubtedly be apparent to those skilled in the art. Furthermore, equivalent elements may be substituted for those illustrated and described herein, parts or connections might be reversed or otherwise interchanged, and certain-features of the invention may be utilized independently of other features. Consequently, the exemplary embodiments should be considered illustrative, rather than inclusive, while the appended claims are more indicative of the full scope of the invention.

The invention claimed is:

1. A vertical electrical device, comprising:
   a region in a substrate extending from a surface of the substrate, the region having an inner wall and an outer wall circumscribing the inner wall;
   an inner electrically conductive layer disposed on said inner wall;
   an outer electrically conductive layer disposed on said outer wall;
   an electrically insulative material disposed between said inner and outer electrically conductive layers; and
   an electrical conductor in said substrate and bounded by said inner electrically conductive layer;
   wherein the electrical conductor and the outer electrically conductive layer extend beyond the substrate at the first surface wherein a portion of said electrically insulative region covers said inner metal electrically conductive layer at said second surface.

2. The device of claim 1, further comprising:
   a first electrical connection between said device and a first electronic circuit on a first circuit layer.

3. The device of claim 2, wherein said first electrical connection comprises a first planar conductor connecting said first electronic circuit to said electrical conductor.

4. The device of claim 2, further comprising:
   a second electrical connection between said device and a second electronic circuit on a second circuit layer.

5. The device of claim 1, wherein said inner electrically conductive layer comprises an inner electrically conductive metal layer and said outer electrically conductive layer comprises an outer electrically conductive metal layer.

6. The device of claim 1, wherein said electrically insulative material comprises an organic material.

7. The device of claim 6, wherein said organic electrically insulative material comprises parylene.

8. The device of claim 1, wherein said electrically insulative material comprises an inorganic material.

9. The device of claim 8, wherein said electrically insulative material comprises an inorganic material selected from the group consisting of oxides and nitrides.

10. The device of claim 1, wherein said substrate comprises a semiconductive substrate.

11. The device of claim 10, wherein said semiconductive substrate comprises a silicon substrate.

12. The device of claim 1, wherein the region comprises a cylindrical region.

13. The device of claim 1, wherein the electrical conductor and the outer electrically conductive layer extend beyond the substrate at the second surface.

14. The device of claim 1, wherein a portion of the electrical conductor proximate said surface of the substrate is reduced in size relative to the remaining portion of the conductor.

15. The device of claim 1, wherein said insulative material and said outer conductive layer provide high frequency signal isolation for said electrical conductor, the device operable thereby as a high frequency shielded electrical conductor.

16. The device of claim 15, wherein the inner electrically conductive layer, the outer electrically conductive layer, the electrically insulative material, and the electrical conductor are fabricated with dimensions and of materials selected to optimize the radio frequency properties of the device.

17. A vertical high frequency shielded electrical conductor, comprising:
   a cylindrical region in a semiconductive substrate extending from a first surface of the substrate, the region having an inner wall, an outer wall circumscribing the inner wall, and a bottom surface between the outer and inner walls;
   an inner metal electrically conductive layer disposed on said inner wall;
   an outer metal electrically conductive layer disposed on said outer wall;

an electrically insulative region disposed between said inner and outer electrically conductive layers and substantially filling the region;

an electrical conductor in said substrate, bounded by said inner electrically conductive layer, and extending through a second surface of said substrate, the electrical conductor thereby forming an electrical interconnect via through said substrate, a portion of said electrically insulative region covering said inner metal electrically conductive layer at said second surface, said insulative region and said outer conductive layer providing high frequency isolation for the electrical interconnect;

wherein said outer conductive layer comprises a first electrode, said electrical conductor comprises a second electrode, and said electrically insulative material is a dielectric material, the device configured thereby as a coaxial capacitor.

18. The device of claim 17, wherein a portion of the second electrode proximate said surface of the substrate is reduced in size relative to the remaining portion of the electrode.

* * * * *